United States Patent [19]

Collins et al.

[11] Patent Number: 4,555,273

[45] Date of Patent: Nov. 26, 1985

[54] FURNACE TRANSIENT ANNEAL PROCESS

[75] Inventors: David A. Collins; Derek L. Lile; Carl R. Zeisse, all of San Diego, Calif.

[73] Assignee: The United States of America as represented by the Secretary of the Navy, Washington, D.C.

[21] Appl. No.: 583,560

[22] Filed: Feb. 27, 1984

[51] Int. Cl.⁴ .................. H01L 21/324; H01L 21/265
[52] U.S. Cl. .................................. 148/1.5; 29/576 B; 29/576 T; 118/500; 118/641; 118/724; 118/728; 148/DIG. 3; 148/DIG. 6; 148/DIG. 71; 148/DIG. 76; 219/385; 219/390; 432/11; 432/45; 432/148; 432/198
[58] Field of Search .................. 29/576 T, 576 B; 148/1.5; 118/500, 641, 724, 728, 900; 219/385, 386, 390; 432/11, 45, 148, 198, 205

[56] References Cited

U.S. PATENT DOCUMENTS

| 2,992,903 | 7/1961 | Imber | 148/175 X |
| 3,723,053 | 3/1973 | Myers et al. | 432/45 X |
| 3,734,693 | 5/1973 | Petcoff | 219/390 X |
| 4,347,431 | 8/1982 | Pearce et al. | 219/390 |
| 4,357,180 | 11/1982 | Molnar | 148/1.5 |

OTHER PUBLICATIONS

Grochowski et al., "Slow Cooling to Minimize Distortion . . . " I.B.M. Tech. Discl. Bull., vol. 14, No. 5, Oct. 1971, p. 1640.

Edel et al., "Capsule Cooling Following Diffusion" I.B.M. Tech. Discl. Bull., vol. 15, No. 6, Nov. 1972, p. 1967.

Primary Examiner—William G. Saba
Attorney, Agent, or Firm—R. F. Beers; E. F. Johnston; Harvey Fendelman

[57] ABSTRACT

A method for annealing semiconductor samples, especially following ion-implantation of semiconductor samples is disclosed. A furnace on a set of rails is passed over the semiconductor sample which is supported on a stationary wire basket made of low thermal mass, fine tungsten wire. The furnace temperature may be about 5° above the desired anneal temperature of the semiconductor sample such that the sample temperature rises to within a few degrees of the furnace temperature within seconds. Utilizing the moveable furnace insures uniform heating without elaborate temperature control or expensive beam generating equipment.

The apparatus and process of the present invention are utilized for rapid annealing of ion-implanted indium phosphide semiconductors within 10 to 30 seconds and at temperatures of approximately 700° C., thereby eliminating undesired and damaging movement of impurities within the ion-implanted InP.

12 Claims, 4 Drawing Figures

FURNACE TRANSIENT ANNEAL PROCESS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to the field of devices and techniques for rapidly raising the temperature of semiconductor samples and, more particularly, to apparatus and techniques for transient annealing of ion-implanted semiconductor samples.

The technique of ion implantation has, over the last ten years, gained wide acceptance as a means whereby the electrical conductivity of semiconductor samples may be selectively modified and controlled in a reproducible and predictable manner. This technique, in particular, has been shown to be appropriate for the fabrication of LSI chips and the processing of large wafers because of its extreme uniformity and its adaptablity to a planar technology via selective implantation of both n-type and p-type as well as deep compensating species via photoresist, oxide, or metal masks. It is well known that essential to this technique, however, is a means whereby, following implantation, the ion species may be made electrically active and lattice damage resulting from the implant may be removed. This is most usually accomplished via annealing wherein the sample is raised in temperature for about ten to fifteen minutes during which time the structural rearrangement of the sample surface region is allowed to take place. Because of the significant temperatures involved (e.g. typically 950° C. for Si, 850° C. for GaAs, and 700° C. for InP) this part of the process has often been a source of difficulty, including the observation of impurity and dopant redistributions due presumably to diffusion and damage gettering and thermal degradation of the surface sample, particularly for the compounds with their highly volatile constituents. In the past, these annealing techniques have usually been accomplished by means of a furnace where a fifteen minute anneal would typically be used.

To help alleviate these problems as well as decrease processing times, transient, short time or "flash" annealing methods have recently been reported wherein the sample is rapidly heated and maintained at an elevated temperature for times no greater than thirty seconds or so. Typically, pulsed or scanned electron beams, laser beams, or high intensity lamps are used to generate the thermal transients with varying degrees of success being reported for both Si as well as compound semiconductors. All of these recently reported systems operate far from thermal equilibruim making accurate measurement of sample temperature difficult.

SUMMARY OF THE INVENTION

In accordance with the present invention the foregoing problems associated with prior art semiconductor heating and annealing techniques are overcome with a furnace transient heating or annealing system and process which is both simple and inexpensive to implement and which has been used successfully to activate a variety of ion-implanted species in InP.

In accordance wit the present invention, the semiconductor sample, which may be capped to prevent the non-congruent dissociation of the surface, is inserted into a preheated hot zone generated by means of a furnace. The system of the present invention includes a single zone gold-coated furnace mounted on rollers which can be readily moved over the stationary, low thermal mass sample mount. Further, in order to assist in controlling the atmosphere within the furnace, a quartz tube closed at its inner end is placed within the furnace within the area enclosed by the furnace heating element and is situated to contain the semiconductor sample when the furnace is moved over the sample mount. By utilizing this quartz having only one opening, the deleterious effects of drafts within the furnace are minimized to thereby more accurately control the atmosphere within the furnace and consequently also the temperature within the furnace.

The response of such a system as is described here is largely a function of the thermal mass of the cold body as well as the degree of coupling between the sample and its surroundings. For the desired maximum rate of temperature change, the sample should be of minimum thermal mass/unit surface area and be only in contact with the radiant and conductive field of the furnace. The former is difficult to control being limited as it is by the intrinsic properties of the semiconductors as well as the geometry of the sample. Most certainly the thinner the sample the better although, of course, technological considerations associated with subsequent processing in general limit wafer thicknesses to no less than approximately 10 mil. The external thermal load on the sample is controllable, however, and in accordance with the present invention, is reduced as much as possible. In order to facilitate this, the present invention utilizes an extremely low thermal mass sample mount which is comprised of a basket of 5 mil diameter tungsten wire attached to a ceramic capillary.

Apart from the advantages of simplicity and ease of implementation, the present invention lends itself readily to uniform heating of the sample with the furnace presumably approaching somewhat the characteristics of a black body. The present invention requires no elaborate transient temperature control system and also leads to uniform heating to a precisely known temperature without the necessity for elaborate radiation pattern designs.

OBJECTS OF THE INVENTION

Accordingly, it is the primary object of the present invention to provide an improved method for rapidly raising the temperature of semiconductor samples, particularly for their annealing following ion-implantation.

It is a further object of the present invention to disclose a technique and apparatus for preventing the motion of impurities in ion-implanted InP when it is annealed.

It is another object of the present invention to disclose a method and apparatus for transient annealing of semiconductor samples which may be accomplished by utilization of a standard, commercially available furnace, modified in accordance with the present invention.

It is a concommitant object of the present invention to disclose an apparatusand technique for the thermal treatment of semiconductor samples in the range of about 650°–900° C. for the activation of implanted ion species.

Other objects, advantages and novel features of the invention will become apparent from the following detailed description of the invention when considered in conjunction with the accompanying drawings.

BRIEF DESCRIPTION OF THE DRAWINGS

FIG. 1a is an enlarged drawing of the sample support basket of the present invention.

DESCRIPTION OF THE PREFERRED EMBODIMENT

Figure 1:
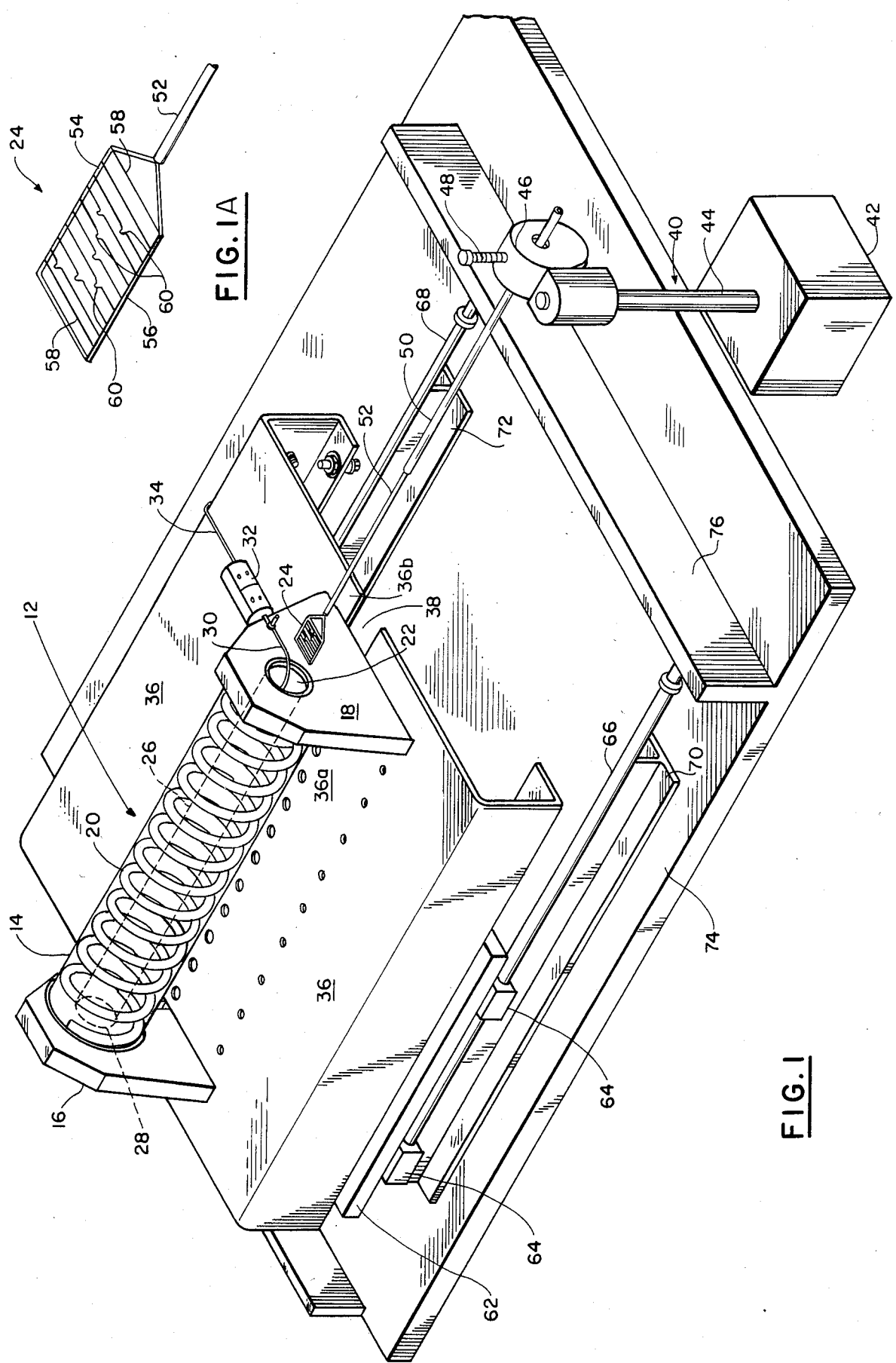
FIG. 1 is an isometric metric schematic diagram of the furnace, rail system and sample support assembly of the present invention.

Referring now to FIG. 1 the apparatus of the present invention will be described. The apparatus of the present invention consists primarily of a modified, commercially available furnace which can be moved smoothly and quickly over a semiconductor sample supported on a low thermal mass holder. The furnace 12 is generally comprised of a gold-reflecting furnace such as the gold-reflecting 1½ muffle commercially available from Trans-Temp Co. of Chelsa, Maine. The furnace 12 is comprised of a gold plated quartz outer tube 14 that is supported by thermally insulating stone end supports 16 and 18. The quartz tube 14 is gold plated on the interior surface such that it is semi-transparent. The gold plating on the interior surface of the quartz tube 14 improves its efficiency while permitting visual observation of the interior. A helical electrical heating coil 20 is positioned within the interior cavity of the quartz tube 14 and extends longitudinally along the length of the quartz tube 14. The helical, electrical heating coil 20 is electrically connected to a power supply (not shown) via electrical leads (not shown) as would be readily understood. The front end support 18 has an aperture 22 for permitting ingress of the sample support basket 24 which is to hold the semiconductor sample that is to be heated. A second quartz tube 28 is positioned within the interior of quartz tube 14 and also within the interior of the helical heating element 20. The quartz tube 26 has a diameter that is substantially the same as the diameter of aperture 22. The quartz tube 26 is open at the end adjacent aperture 22 and, quite importantly, is closed at its end 28 that is adjacent the thermally insulating stone end support 16. By this construction, the semiconductor sample to be heated is contained within the interior of quartz tube 26 when it is placed within the furnace 12 for heating. By utilization of quartz tube 26 having one closed end, drafts are prevented from developing within the interior of the furnace and atmospheric control and stability is maintained within the furnace cavity. A thermocouple tube 30 is connected via electrical plug 32 and electrical conductor 34 to a meter (not shown) for sensing the temperature within the interior cavity of the furnace 12 as would be readily understood by those of ordinary skill in this art.

The furnace assembly 12 is mounted on a stand-off support fixture 36 which may be made of metal or other suitable material. The furnace assembly 12 may be rested on the stand-off support fixture 36 or, if desired, it may be secured to it. The stand-off support assembly 36 is preferably made of one piece of metal which has a first portion 36a and a second 36b which extend under the end supports 16 and 18. The sections 36a and 36b are separated at the front end by notch 38 which extends to the space under support 18 for permitting the furnace assembly 12 and stand-off support 36 to move as close as possible to sample holder support structure 40 which includes base member 42, support rod 44, clamp assembly 46, tightening bolt 48, connecting rod 50 and ceramic capillary 52 to which the sample support basket assembly 24 is secured.

Referring to FIG. 1a there is shown an enlarged view of the sample support basket 24 of the present invention. The sample support basket is comprised of frame support members 54 and 56 which are spanned by wires 58 as is illustrated. The wires are positioned sufficiently close together so as to be capable of supporting the semiconductor sample to be heated. They may also be formed with ridges 60 to further reduce the support contact area with the sample. In the preferred embodiment of the present invention the frame support arms 54 and 56 and the wires 58 are formed of thin tungsten so as to impart a low thermal mass to the sample support basket 24. It is to be understood that, although tungsten is used in the preferred embodiment of the present invention, other low thermal mass materials could be used within the scope of the present invention. Also in the preferred embodiment of the present invention the wires 58 are 5 mil wires.

Referring again to FIG. 1, the stand-off support fixture 36 is secured to platform base members 62 which may be formed of metal or other suitable material, it being understood that the platform base member 62 under stand-off support fixture section 36b is not shown in the drawings. The platform base member 62 rests on and may be secured to pillow blocks 64 which are bearing assemblies and which are in slidable engagement with the rails 66 and 68. It is to be understood that an identical set of pillow blocks 64 are in slidable engagement with rail 68 although they are not seen in the illustration of FIG. 1. The rails 66 and 68 in turn are supported on T-beams 70 and 72, respectively. The T-beams 70 and 72 in turn are supported on a table or other platform 74 which includes wall 76 to which the rails 66 and 68 are secured.

In the operation of the apparatus of the present invention and in the performance of the method of the present invention, the furnace 12 is preheated to a constant temperature preferably about 5° above the temperature to which the semiconductor sample is to be heated. The semiconductor sample is then placed upon the sample support basket 24 and is held there in a stationary position. The furnace 12 is then moved by sliding the furnace 12, the support fixture 36 and the platform base 62 along the rails 66 and 68 by means of the pillow blocks 64. Depending upon the thermal mass of the semiconductor sample and that of the sample holder 24, as well as the characteristics of the furnace, the semiconductor sample will rise rapidly to within a few degrees of the furnace temperature. After the required heating or anneal time, the furnace is then withdrawn along the rails and moved off of the sample. The entire procedure can be conducted in air or in any desired ambient by surrounding the sample with the desired gas. For maximum heating rate, the thermal mass of the semiconductor sample and the heated ambient should, however, be low. For critical samples, such as InP and GaAs, where even for short anneal times dissociation of the compound in loss of the more volatile component can be a problem, a suitable capping layer, as is used in conventional annealing may be used as is described below.

Figure 2:
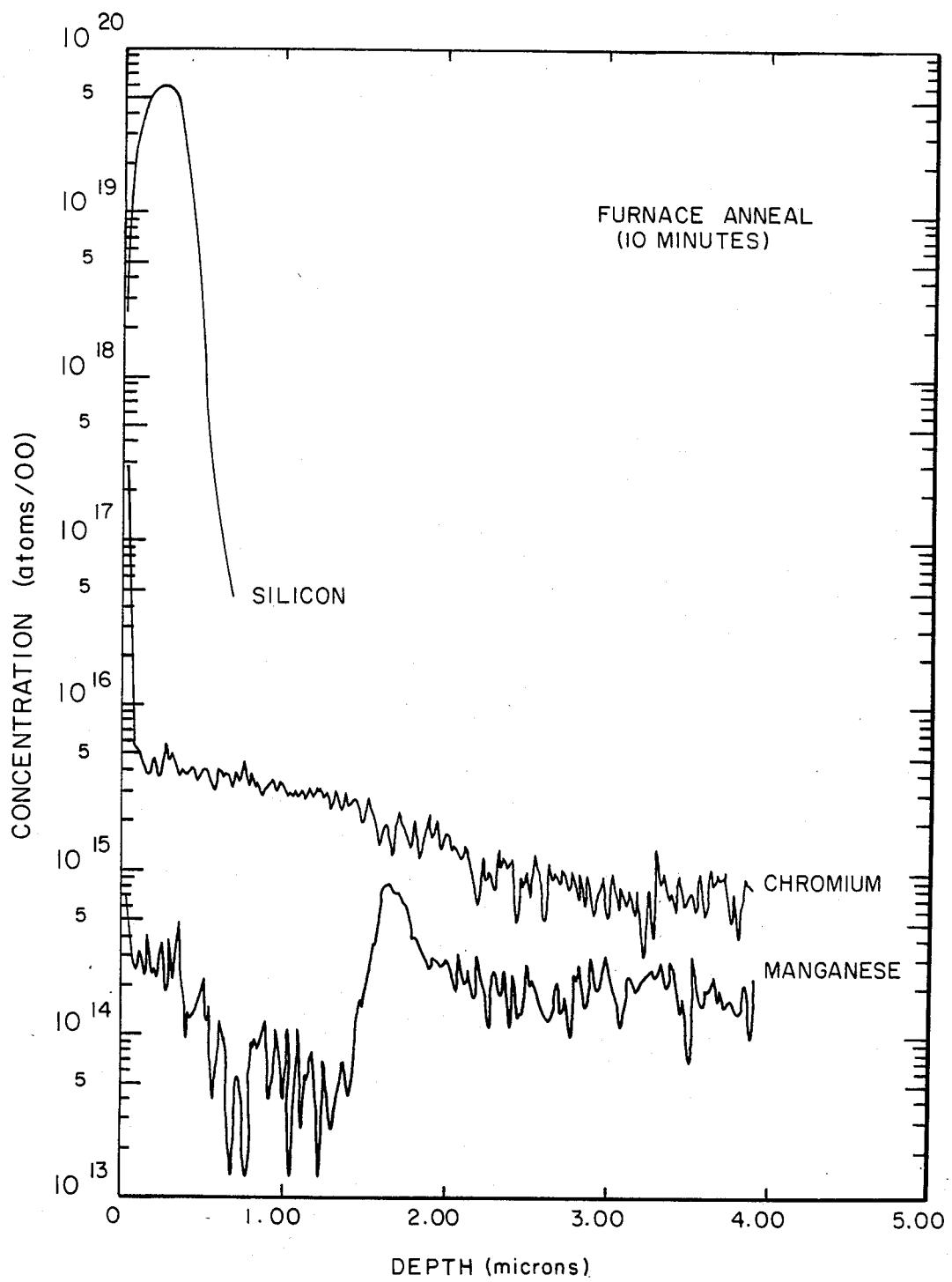
FIG. 2 is a plot of atom density versus depth of an atomic scan of Si, Mn and Cr near the surface of an InP sample that was annealed in a conventional manner for ten minutes at 700° C.

FIG. 2 shows a atomic scan of Si, Mn and Cr near the surface of a semiconductor sample of InP that was annealed in a conventional manner for ten minutes at 700° C. The Si was implanted into the InP before the anneal to make an electron layer. The Cr and Mn are residual impurities which act as acceptors in InP. The amounts of Cr and Mn have changed at the surface during the anneal as is depicted in FIG. 2. It is unclear at present what force drives this motion: it does not appear to be a diffusion mechanism since there is no gradient in impurity concentration at the beginning of the anneal. The problem is that the motion is not under control during the anneal. The amount of electrical compensation provided by these acceptors is therefore unpredictable. Consequently, the electrical properties of the implanted electron layer itself are unreliable. The problem is especially severe for much lighter doses of Si than those shown in FIG. 2.

In accordance with the present invention the system illustrated in FIG. 1 can be used to perform a transient anneal of InP. InP samples can be raised to 700° C. or more in ten seconds. In accordance with the present invention, capping layers of either $SiO_2$ or $Al_2O_3$ may be deposited by the indirect plasma pyrolysis of silane and tri-methyl aluminum with oxygen, respectively, to successfully preserve the integrity of the InP sample surface during annealing. Layers of $Al_2O_3$, with thicknesses of 1,000 to 2,000 A may be used to allow for annealing in air with no perceptible surface degradation as determined by Nomarski Interference Microscopy to temperatures as high as 800° C. for fifteen minutes. Following such capping procedures, in accordance with the present invention, the InP sample is placed upon the sample support basket 24 and the heating or annealing procedure proceeds as decribed above. Thus, the system and method of the present invention satisfies the minimum requirements for an annealing system, namely, that significant electrical activation occurs and thatthe sample surface remains undamaged. InP capped with $Al_2O_3$ has been demonstrated to meet both these requirements after thirty seconds of annealing in the system of FIG. 1.

Figure 3:
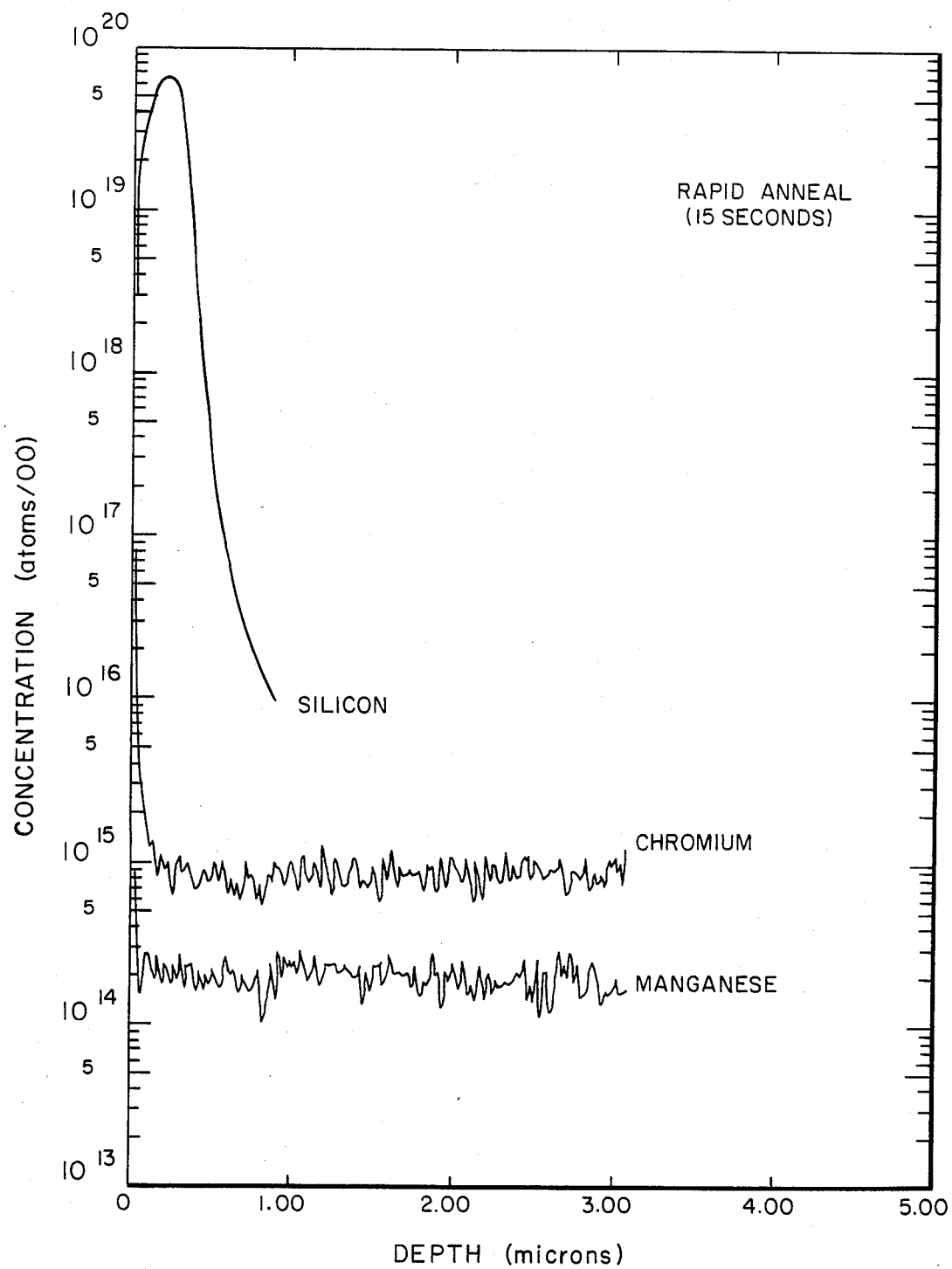
FIG. 3 is a plot of atom density versus depth showing the atomic profile for implanted Si and residual Cr and Mn after a fifteen second anneal at 700° C. of InP in accordance with the present invention.

The primary advantage of the rapid anneal process of the present invention is that impurity motion is greatly reduced and that thermal stressing of the sample is minimized. This former fact is emphasized in FIG. 3 which shows the atomic profiles for implanted Si and residual Cr and Mn after a fifteen second anneal of InP at 700° C. The Cr and Mn retain their bulk concentration levels right up to the implanted region to the surface.

Obviously many modifications and variations of the present invention are possible in the light of the above teachings. It is therefore to be understood that within the scope of the appended claims the invention may be practiced otherwise than as specifically described.

What is claimed is:

1. A method of rapidly raising the temperature of a semiconductor sample comprising the steps of:
   (a) providing a furnace having a single aperture through which said semiconductor sample can be placed within the interior of said furnace, said furnace being otherwise closed and having no other apertures through which heat can escape;
   (b) affixing said furnace to a moveable assembly such that said furnace can be moved along a designated path;
   (c) placing said semiconductor sample upon a stationary semiconductor sample support assembly that is adjacent said furnace and aligned to be within said designated path such that said furnace can be advanced along said designated path so as to enclose said semiconductor sample and such that said furnace can also be withdrawn along said designated path;
   (d) preheating said furnace to a desired temperature;
   (e) advancing said furnace along said designated path such that said semiconductor sample enters said preheated furnace through said aperture;
   (f) retaining said semiconductor sample within said furnace for a period of time on the order of 10 to 30 seconds;
   (g) withdrawing said furnace back along said designated path to remove said semiconductor sample from said furnace.

2. The method of claim 1 further comprising the steps of:
   ion implanting said semiconductor sample prior to being placed upon said sample support; and
   retaining said semiconductor sample within said furnace sufficiently long to activate said ion implant.

3. The method of claim 1 wherein:
   said stationary semiconductor sample support assembly comprises a low thermal mass sample support holder.

4. The method of claim 1 wherein said low thermal mass sample support holder comprises:
   a grid structure made of fine wire;
   an elongated ceramic capillary connected to said grid structure; and
   a support stand secured to said elongated ceramic capillary.

5. The method of claim 4 wherein said wire is tungsten.

6. The method of claim 4 wherein said wire has a plurality of ridges for minimizing the contact area with said semiconductor sample.

7. The method of claim 1 further comprising the step of:
   cooling said semiconductor sample following its withdrawal from said oven.

8. The method of claim 1 wherein said furnace comprises:
   a first quartz having a gold plating on the interior surface thereof;
   a helical electrical heating element positioned within said first quartz tube;
   a second quartz tube positioned within the space enclosed by said helical electrical heating element and having a first end that is open to receive said semiconductor sample and having no other openings therein.

9. The method of claim 1 wherein said semiconductor sample comprises ion implanted InP.

10. The method of claim 9 wherein:
    said step of preheating said furnace to a desired temperature comprises the step of preheating furnace to approximately 700° C.

11. The method of claim 9 further comprising the step of capping said sample of InP with a layer of $SiO_2$ prior to placing said semiconductor sample upon said stationary support assembly.

12. The method of claim 9 further comprising the step of capping said semiconductor sample of InP with a layer of $Al_2O_3$ prior to placing said semiconductor sample upon said stationary support assembly.

* * * * *